US006852464B2

(12) United States Patent
Kitson

(10) Patent No.: US 6,852,464 B2

(45) Date of Patent: Feb. 8, 2005

(54) METHOD OF MANUFACTURING A THERMALLY IMAGEABLE ELEMENT

(75) Inventor: Paul Kitson, Evans, CO (US)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 20 days.

(21) Appl. No.: 10/044,261

(22) Filed: Jan. 10, 2002

(65) Prior Publication Data

US 2003/0157422 A1 Aug. 21, 2003

(51) Int. Cl.$^7$ ............................ G03F 7/023; G03F 7/30

(52) U.S. Cl. ....................... 430/168; 430/166; 430/302; 430/330

(58) Field of Search ................................ 430/168, 166, 430/302, 330

(56) References Cited

U.S. PATENT DOCUMENTS

| | | | | | |
|---|---|---|---|---|---|
| 4,191,570 | A | * | 3/1980 | Herting et al. | 430/302 |
| 4,427,765 | A | * | 1/1984 | Mohr et al. | 430/525 |
| 4,532,005 | A | | 7/1985 | Grieco et al. | 216/47 |
| 4,581,321 | A | * | 4/1986 | Stahlhofen | 430/325 |
| 4,708,925 | A | | 11/1987 | Newman | 430/270 |
| 5,563,011 | A | | 10/1996 | Shipley | 430/7 |
| 5,609,995 | A | | 3/1997 | Akram et al. | 430/327 |
| 6,294,311 | B1 | | 9/2001 | Shimazu et al. | 430/271.1 |
| 6,352,811 | B1 | | 3/2002 | Patel et al. | 430/270.1 |
| 6,352,812 | B1 | | 3/2002 | Shimazu et al. | 430/273.1 |
| 6,358,669 | B1 | | 3/2002 | Savariar-Hauck et al. | 430/273.1 |
| 6,555,291 | B1 | * | 4/2003 | Hauck | 430/302 |
| 6,593,055 | B2 | * | 7/2003 | Shimazu et al. | 430/166 |

FOREIGN PATENT DOCUMENTS

| | | |
|---|---|---|
| EP | 0 708 372 A1 | 4/1996 |
| EP | 0 823 327 A2 | 2/1998 |
| EP | 0 864 420 A1 | 9/1998 |
| EP | 0 908 305 A1 | 4/1999 |
| EP | 0 908 307 A2 | 4/1999 |
| EP | 0 908 779 A1 | 4/1999 |
| EP | 0 908 784 A1 | 4/1999 |
| EP | 0 940 266 A1 | 9/1999 |
| EP | 0 950 518 A1 | 10/1999 |
| EP | 0 960 728 A1 | 12/1999 |
| EP | 1 023 994 A1 | 8/2000 |
| GB | 1 245 924 | 2/1972 |
| JP | 2001042509 | 2/2001 |
| JP | 2001042510 | 2/2001 |

* cited by examiner

*Primary Examiner*—John S. Chu

(74) *Attorney, Agent, or Firm*—RatnerPrestia

(57) ABSTRACT

Methods of manufacturing multi-layer thermally imageable elements useful as lithographic printing plate precursors are disclosed. The elements comprise a substrate, an underlayer, and an imageable layer. The imageable layer comprises a first polymeric material and o-diazonaphthoquinone containing material. After the underlayer has been coated over the substrate and the imageable layer has been coated over the underlayer, the element is heated to between about 130° C. and about 200° C. for a time sufficient to decrease the sensitivity of the imageable element to the white light.

20 Claims, No Drawings

METHOD OF MANUFACTURING A THERMALLY IMAGEABLE ELEMENT

FIELD OF THE INVENTION

The invention relates to imageable elements useful in lithographic printing. More particularly, this invention relates methods of manufacturing multi-layer thermally imageable elements useful as lithographic printing plate precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

If after exposure to radiation, the exposed regions of the coating are removed in the developing process, revealing the underlying hydrophilic surface of the support, the plate is called as a positive-working printing plate. Conversely, if the unexposed regions are removed by the developing process and the exposed regions remain, the plate is called a negative-working plate. In each instance, the regions of the radiation-sensitive layer (i.e., the image areas) that remain are ink-receptive and the regions of the hydrophilic surface revealed by the developing process accept water, typically a fountain solution, and repel ink.

Direct digital imaging of offset printing plates, which obviates the need for exposure through a negative, is becoming increasingly important in the printing industry. Thermally imageable, multi-layer imageable elements that comprise a hydrophilic substrate, an alkali developer soluble underlayer, and a thermally imageable layer have been disclosed. On infrared exposure, the exposed regions of the imageable layer become soluble in or permeable by the alkaline developer. The developer penetrates the imageable layer and removes the underlayer, revealing the underlying substrate.

The imageable layer of these elements comprises a dissolution inhibitor, which suppresses removal of the imageable layer in the unexposed regions. Materials that comprise the o-diazonaphthoquinone group are excellent dissolution inhibitors. However, because o-diazonaphthoquinones are sensitive to "white light" or "room light," the resulting imageable element is sensitive to white light. Thus, a need exists for a method of decreasing the white light sensitivity of o-diazonaphthoquinone containing positive-working thermally imageable elements.

SUMMARY OF THE INVENTION

In one aspect, the invention is a method for forming a multi-layer positive-working imageable element comprising:

a substrate comprising a hydrophilic surface;

an underlayer over the hydrophilic surface of the substrate; and an imageable layer over the underlayer;

the method comprising the steps of:

(a) coating the underlayer over a hydrophilic surface of the substrate;

(b) coating the imageable layer over the underlayer; and (c) heating the imageable element at a temperature between about 130° C. and about 200° C. for a time sufficient to increase resistance of the imageable element to an alkaline developer and to decrease the white light sensitivity of the imageable element;

in which:

the imageable element comprises a photothermal conversion material;

the imageable layer is ink receptive;

the imageable layer is insoluble in the alkaline developer;

the imageable layer comprises:

a first polymeric material, and an o-diazonaphthoquinone containing material; and the underlayer comprises a second polymeric material.

The method decreases the white light sensitivity of o-diazonaphtho-quinone containing positive-working thermally imageable elements.

DETAILED DESCRIPTION OF THE INVENTION

Unless the context indicates otherwise, in the specification and claims, the terms "first polymeric material," "second polymeric material," "photothermal conversion material," "o-diazonaphthoquinone containing material," "coating solvent," and similar terms also refer to mixtures of such materials. As is well known to those skilled in the art, when a polymer or copolymer is described as comprising a particular monomer, it is understood that the polymer or copolymer comprises the monomer in polymerized form.

IMAGEABLE ELEMENTS

The imageable elements comprise a substrate, an underlayer over the substrate; and an imageable layer over the underlayer. Multi-layer imageable elements are disclosed in U.S. applns. Ser. No. 09/801,866, allowed Sep. 27, 2001; Ser. No. 09/469,490, filed Dec. 22, 1999, allowed Oct. 09, 2001; Ser. No. 09/469,489, filed Dec. 2, 1999, allowed Oct. 05, 2001; Ser. No. 09/592,895, filed Jun. 13, 2000, and Ser. No. 09/729,765, filed Dec. 5, 2000.

Substrate

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m. Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and imageable layer) may be coated with an antistatic agent and/or a slipping layer or matte layer to improve handling and "feel" of the imageable element.

Imageable Layer

The imageable layer is ink receptive and protects the underlying underlayer from the developer. The imageable layer comprises a first polymeric material and an o-diazonaphthoquinone containing material. These need not be separate materials. When the first polymeric material is derivatized with groups that contain the o-diazonaphthoquinone moiety and the imageable layer consists essentially of the derivatized polymeric material, the first polymeric material and the o-diazonaphthoquinone containing material are the same material.

The imageable layer is insoluble in alkaline developer prior to imaging. However, exposed (i.e., imaged) regions of the imageable layer are removable by an alkaline developer after thermal imaging. Though not being bound by any theory or explanation, it is believed that thermal exposure causes the imageable layer to more readily dissolve or disperse in the developer and/or weakens the bond between the imageable layer and the underlayer. This allows the developer to penetrate the imageable layer and remove the underlayer in the exposed regions, revealing the underlying hydrophilic surface of the substrate.

The imageable layer comprises a first polymeric material, which is a light-stable, water-insoluble, alkaline developer soluble or removable, film-forming polymeric material that has a multiplicity of phenolic hydroxyl groups either on the polymer backbone or on pendant groups. These groups impart alkaline developer developability to the imageable layer. Novolac resins, resol resins, acrylic resins that contain pendent phenol groups, and polyvinyl phenol resins are preferred phenolic resins. Other phenolic resins useful as the polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

Novolac resins are more preferred. Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Novolac resins prepared by reacting m-cresol, mixtures of m-cresol and p-cresol, or phenol with formaldehyde are particularly useful.

The imageable layer comprises an o-diazonaphthoquinone containing material. These material are well known. They are described, for example, in Chapter 5 of *Photoreactive Polymers: the Science and Technology of Resists*, A. Reiser, Wiley, N.Y., 1989, pp. 178–225. The o-diazonaphthoquinone moiety may be bonded to the polymeric material and/or it may be in a separate compound.

Compounds that contain the o-diazonaphthoquinone moiety (i.e., quinonediazides), preferably compounds that comprise an o-diazonaphtho-quinone moiety attached to a ballasting moiety that has a molecular weight of at least 1500, but less than about 5000, are preferred. Typically, these compounds are prepared by the reaction of a 1,2-naphthoquinone diazide having a halogeno-sulfonyl group, typically a sulfonylchloride group, at the 4- or 5-position with a mono- or poly-hydroxyphenyl compound, such as mono- or polyhydroxy-benzophenone.

Useful compounds include, but are not limited to: 2,4-bis(2-diazo-1,2-dihydro-1-oxo-5-naphthalenesulfonyloxy)benzophenone; 2-diazo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthal-enesulfonic acid; 2,2'-bis(2-diazo-1,2-dihydro-1-oxo-5-naphthalenesulfonyloxy)-biphenyl; 2,2',4,4'-tetrakis(2-diazo-1,2-dihydro-1-oxo-5-naphthalenesulfonyloxy)-biphenyl; 2,3,4-tris(2-diazo-1,2-dihydro-1-oxo-5-naphthalenesulfonyloxy)benzo-phenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxy-phenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis(2-diazo-1,2-dihydro-1-oxo-4-naphthalenesulfonyloxy)biphenyl; 2,3,4-tris(2-diazo-1,2-dihydro-1-oxo-4-naphthalenesulfonyloxy)benzophenone; and others known in the art, for example, those described in Mizutani, U.S. Pat. No. 5,143,816.

Alternatively, or additionally, the imageable layer may comprise a polymeric diazonaphthoquinone compound. Polymeric diazonaphthoquinone compounds include derivatized resins formed by the reaction of a reactive derivative that contains a diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322. An example of a polymer derivatized with a compound that comprises a diazonaphthoquinone moiety is P-3000, a naphthoquinone diazide of a pyrogallol/acetone resin (available from PCAS, France).

It will be appreciated by those skilled in the art that although phenolic polymers that have been derivatized with groups that contain the diazonaphthoquinone moiety are soluble in or removable by an alkaline developer, a layer comprising or consisting essentially of one or more of these materials is "insoluble" in the developer. This is because "solubility" and "insolubility" of the imageable layer are determined by the relative rates at which the imaged and unimaged regions of the layer are removed by the developer. Following imagewise thermal exposure of a layer comprising one or more of derivatized phenolic polymeric materials, the exposed regions of the layer are removed by the developer more rapidly than the unexposed regions. If the development step is carried out for an appropriate time, the exposed regions are removed and the unexposed regions remain, so that an image made up of the unexposed regions is formed. Hence the exposed regions are "removable" or "soluble" in the aqueous developer and the unexposed regions are "not removable" or "insoluble" in the alkaline developer.

The imageable layer may also comprise a dye to aid in the visual inspection of the exposed and/or developed element. However, when the photothermal conversion material is in the underlayer, the imageable layer should not absorb the imaging radiation so dyes that absorb the imaging radiation should not be used in the imageable layer. Printout dyes distinguish the exposed regions from the unexposed regions during processing. Contrast dyes distinguish the unimaged regions from the imaged regions in the developed imageable element. Triaryimethane dyes, such as ethyl violet, crystal violet, malachite green, brilliant green, Victoria blue B, Victoria blue R, and Victoria pure blue BO, may act as a contrast dye.

When the imageable layer comprises a phenolic polymer that has been derivatized with groups that contain the diazonaphthoquinone moiety, the imageable layer typically comprises about 30 wt % to 100 wt % of the derivatized polymer, based on the total dry composition weight of the imageable layer. More typically the imageable layer comprises about 30 wt % of the derivatized polymer and about 68 wt % to 70 wt % of the underivatized polymer, based on the total dry composition weight of the imageable layer. When the imageable layer comprises an o-diazonaphthoquinone moiety attached to a ballasting moiety that has a molecular weight of at least 1500 but less than about 5000, the o-diazonaphtho-quinone containing compound typically comprises about 0.5 wt % to about 30 wt %, preferably about 1 wt % to 15 wt %, based on the total dry composition weight of the imageable layer. In either case, about 2 wt % of contrast dye, based on the total dry composition weight of the imageable layer, is typically added to make result assessment easier.

Underlayer

The underlayer is between the hydrophilic surface of the substrate and the imageable layer. After imaging, it is removed by the developer to expose the underlying hydrophilic surface of the substrate. It is preferably soluble in the alkaline developer to prevent sludging of the developer.

The underlayer comprises a second polymeric material. The second polymeric material is soluble in an alkaline developer. In addition, the second polymeric material is preferably insoluble in the solvent used to coat the imageable layer so that the imageable layer can be coated over the underlayer without dissolving the underlayer.

Polymeric materials useful as the second polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are copolymers that comprise N-substituted maleimides, especially N-phenylmaleimide; polyvinylacetals; methacrylamides, especially methacylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in alkaline developers. In addition, they are soluble in methyl lactate/methanol/dioxolane (15:42.5:42.5 wt %) mixture, which can be used as the coating solvent for the underlayer. However, they are poorly soluble in solvents such as acetone, which can be used as solvents to coat the top layer on top of the underlayer without dissolving the underlayer. These polymeric materials are typically resistant to washes with 80 wt % diacetone alcohol/20 wt % water.

Another group of preferred polymeric materials for the second polymeric material are alkaline developer soluble copolymers that comprise a monomer that has a urea bond in its side chain (i.e., a pendent urea group), such are disclosed in Ishizuka, U.S. Pat. No. 5,731,127. These copolymers comprise about 10 to 80 wt %, preferably about 20 to 80 wt %, of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

R is -preferably $CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$[CH_2{=}C(CH_3){-}CO_2{-}CH_2CH_2{-}NH{-}CO{-}NH\text{-}p\text{-}C_6H_4{-}Z],$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in alkaline developers. In addition, they are soluble in polar solvents, such as ethylene glycol monomethyl ether, which can be used as the coating solvent for the underlayer. However, they are poorly soluble in less polar solvents, such as 2-butanone(methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Other alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacryl-amide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, the second polymeric material has a one-minute soak loss of less than about 20%, more preferably less than about 10%, and most preferably less than about 5% in 80 wt % diacetone alcohol/20 wt % water, and the second polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 $g/m^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, more preferably greater than about 0.6. In favorable cases, a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacylamide; and acrylic and/or methacrylic acid, especially methacrylic acid with (2) an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl) methacrylamide N-(o-aminosulfonylphenyl) methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight the first and second polymeric materials in the underlayer. The first and second polymeric materials together typically comprise at least about 50 wt %, preferably at least about 60 wt %, and more preferably at least about 65 wt %, of the underlayer, based on total weight of the materials in the underlayer. Up to about 20 wt %, preferably about 1 to about 20 wt %, of other polymeric materials may be present in the underlayer, based on the total amount of all the polymeric materials in the underlayer.

Photothermal Conversion Material

The element comprises a photothermal conversion material. The photothermal conversion material may be present in the imageable layer, the underlayer, or in both the imageable layer and the underlayer. To minimize ablation of the imageable layer during thermal imaging, preferably, the photothermal conversion material is in the underlayer and the imageable layer is substantially free of photothermal conversion material.

Photothermal conversion materials absorb radiation and convert it to heat. Photothermal conversion materials may absorb ultraviolet, visible, and/or infrared radiation and convert it to heat. Although the first or second polymeric materials may comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), Trump IR Dye (Eastman Kodak, Rochester, N.Y.), and IR Dyes B, C, and D, whose structures are shown below.

The amount of photothermal conversion material in the element is generally sufficient to provide an optical density of at least 0.05, and preferably, an optical density of from about 0.5 to about 2 at the imaging wavelength. As is well known to those skilled in the art, the amount of an absorber required to produce a particular optical density can be determined from the thickness of the layer and the extinction coefficient of the absorber at the wavelength used for imaging using Beers law.

Preparation of the Imageable Elements

The thermally imageable elements are prepared by sequentially applying the underlayer over the hydrophilic surface of the substrate and then applying the imageable layer over the underlayer using conventional coating and/or lamination methods. Typically the ingredients are dispersed or dissolved in a suitable coating solvent, and the resulting mixture coated by conventional methods, such as spin coating, bar coating, gravure coating, or roller coating.

The solvent used to coat each of the layers depends on the nature of the first polymeric material, the photothermal conversion material, and the second polymeric material, as well as the other ingredients present in the layers, if any. To prevent the underlayer from dissolving and mixing with imageable layer, the coating solvent for the imageable layer may be a solvent in which the second polymeric material and the other components of the underlayer, if any, are essentially insoluble. Typically the first polymeric material will be soluble in more polar solvents and insoluble in less polar solvents so that the solvent used to coat the underlayer is more polar than the solvent used to coat the top layer.

To minimize ablation during exposure, preferably the photothermal conversion material is in the underlayer and the imageable layer is substantially free of photothermal conversion material. It has been found that the top layer remains essentially free of photothermal conversion material when the top layer is coated onto an underlayer comprising IR Dye B, whose structure is shown below. The top layer is coated from diethyl ketone, methyl iso-butyl ketone, methyl iso-butyl ketone/methyl ethyl ketone (about 50:50 by weight), methyl ethyl ketone/toluene/3-ethoxyproprionate (about 50:20:30 by weight), or a similar solvent. The underlayer may be coated, for example, from an about 50:40:10 wt % mixture of methyl lactate, diethyl ketone, and water; an about 50:25:15:10 wt % mixture of methyl lactate, diethyl ketone, butyrolactone, and water; an about 15:42.5:42.5 wt % mixture of methyl lactate/methanol/dioxolane; or a similar solvent.

Following coating, the imageable element may be dried to remove the coating solvent, either by air drying at room temperature or by heating at about 100° C. for about 1 to 2 minutes.

Heat Treatment

After drying, the element is heated at a temperature and for a time sufficient to increase resistance of the imageable element to an alkaline developer and reduce the white light sensitivity of the imageable element.

The imageable element is heated at a temperature greater than about 130° C. Although the time and temperature of heating required will depend on the coating weight and the amount of o-diazonaphthoquinone in the imageable layer, typically the element is heated for about 30 seconds to 10 minutes. A heat treatment of at least about 10 minutes is required when the element is heated at about 140° C. A heat treatment of at least about 120 seconds or more is required when the element is heated at about 150° C. A heat treatment of about 120 seconds is required when the element is heated at about 160° C. The imageable element should not be heated above about 200° C. for any significant period of time.

Imaging and Processing

The positive-working thermally imageable elements of the invention may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging thermally imageable elements. Imaging is conveniently carried out with a laser emitting at about 830 nm or at about 1056 nm. Suitable commercially available imaging devices include image setters such as the Creo Trendsetter (CREO, British Columbia, Canada) and the Gerber Crescent 42T (Gerber).

Imaging produces an imaged element, which comprises a latent image of imaged (unexposed) regions and non-imaged (exposed) regions in the imageable layer. Development of the imaged element to form a lithographic printing plate, or printing form, converts the latent image to an image by removing the exposed regions, revealing the hydrophilic surface of the underlying substrate.

The developer may be any liquid or solution that can penetrate and remove the exposed regions of the imageable layer and the underlying regions of the underlayer, without substantially affecting the complimentary unexposed regions. Useful developers are aqueous solutions having a pH of about 7 or above. Preferred alkaline developers are those that have a pH between about 8 and about 13.5, typically at least about 9, preferably at least about 10. Wholly aqueous developers, i.e., those that do not comprise an added organic solvent, may be used. Useful developers include commercially available developers, such as PC3000, PC955, PC 956, and PC9000, alkaline developers each available from Kodak Polychrome Graphics LLC. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

While not being bound by any theory or explanation, it is believed that image discrimination is based on a kinetic effect. The exposed regions of the imageable layer are removed more rapidly in the developer than the unexposed regions. Development is carried for a long enough time to remove the exposed regions and reveal the underlying substrate, but not long enough to remove the unexposed regions. Hence, the exposed regions are described as being "soluble" or "removable" in the developer because they are removed, and dissolved and/or dispersed, more rapidly in the developer than the unexposed regions. Typically, the underlayer is dissolved in the developer and the imageable layer is dispersed or dissolved in the developer.

Development is typically carried out in a processor equipped with an immersion-type-developing bath, a section for rinsing with water, a gumming section, a drying section, and a conductivity-measuring unit. Typically, the developer is applied to the imaged precursor by rubbing or wiping the element with an applicator containing the developer. Alternatively, the imaged precursor may be brushed with the developer or the developer may be applied to the precursor by spraying the element with sufficient force to remove the exposed regions. In either instance, a printing plate is produced. Development may be carried out in a commercially available processor, such as a Mercury Mark V Processor, an 85NS processor or a Sword 2 processor (all available from Kodak Polychrome Graphics).

In either instance, a developed element, typically a lithographic printing plate, is produced. The developed element comprises (1) regions in which the imageable layer and underlying layer have been removed in the exposed regions revealing the underlying surface of the hydrophilic substrate, and (2) complimentary unexposed regions in which the imageable layer and underlying layer have not been removed.

Following development, the lithographic printing plate is typically rinsed with water and dried. Drying may be conveniently carried out by infrared radiators or with hot air. After drying, the lithographic printing plate may be treated with a gumming solution, if desired. A gumming solution comprises one or more water-soluble polymers, for example polyvinyl alcohol, polymethacrylic acid, polymethacrylamide, polyhydroxyethylmethacrylate, polyvinylmethylether, gelatin, and polysaccharide such as dextran, pullulan, cellulose, gum arabic, and alginic acid. A preferred material is gum arabic.

For printing, the lithographic printing plate is mounted on a lithographic printing press. Printing may be carried out by applying a fountain solution and then lithographic ink to the image on the surface of the plate. The fountain solution is taken up by the imaged (exposed) regions, i.e., the surface of the hydrophilic substrate revealed by imaging and development, and the ink is taken up by the unimaged (unexposed) regions. The ink is then transferred to a suitable receiving material (such as cloth, paper, metal, glass or plastic) either directly or indirectly through the use of an intermediate offset printing blanket to provide an impression of the image. The printing plate can be cleaned between impressions, if desired, using conventional cleaning means.

The advantageous properties of this invention can be observed by reference to the following examples, which illustrate but do not limit the invention.

EXAMPLES

Glossary

BYK 307 Polyethoxylated dimethylpolysiloxane copolymer (Bky-Chemie, Wallingford, Conn., USA)

Copolymer 1 Copolymer of N-phenylmaleimide, methacrylamide, and methacrylic acid (45:35:20 mol %)

Copolymer 2 Copolymer of N-phenylmaleimide, methacrylamide, and methacrylic acid (50:35:15 mol %)

Ethyl Violet C.I. 42600; CAS 2390-59-2 ($\lambda_{max}$=596 nm) $[(p\text{-}(CH_3CH_2)_2NC_6H_4)_3C^+Cl^-]$ IR Dye A Trump IR Dye, Infrared absorbing dye ($\lambda_{max}$=830 nm) (Eastman Kodak, Rochester, N.Y., USA)

IR Dye B Infrared absorbing dye (Eastman Kodak, Rochester, N.Y., USA)

LB-6564 Phenol/cresol novolac resin (Bakelite AG, Iserlohn-Letmathe, Germany)

P-3000 A 214 naphthoquinone diazide sulfonate ester of a pyrogallol/acetone resin (PCAS, Longjumeau, France)

P-5320 A 215 naphthoquinone diazide sulfonate ester of a pyrogallol/acetone resin (Koyo Chemicals, Sakai, Osaka, Japan)

SD140A Novolac resin (Borden Chemical, Columbus, Ohio, USA)

IR Dye A

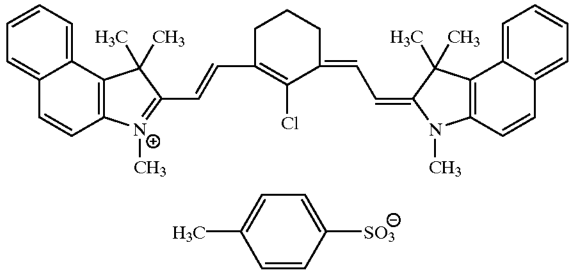

-continued

IR Dye B

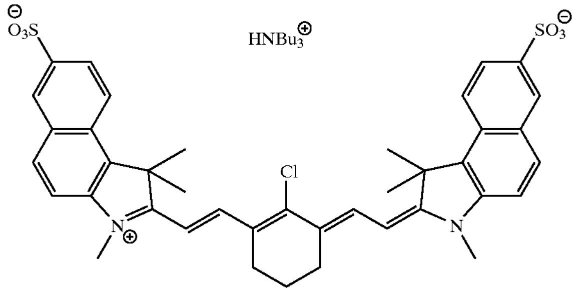

Example 1

This example describes the preparation of Copolymer 1 and Copolymer 2.

Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) were added and dissolved with stirring. 2,2-Azobisisobutyronitrile (AIBN) (3.4 g) was added and the reaction mixture heated at 60° C. with stirring for 22 hr. Then methanol was added. The precipitated Copolymer 1, a copolymer of N-phenylmaleimide, methacrylamide, and methacrylic acid (45:35:20 mol %), was filtered, washed twice with methanol, and dried in the oven at 40° C. for 2 days.

If the polymerization is carried out in 1,3-dioxolane, in some cases reprecipitation can be avoided. The monomers are soluble in 1,3-dioxolane, but the polymeric material is insoluble and precipitates during the reaction.

By appropriate modification of the relative amounts of methacrylic acid, N-phenylmaleimide, and methacrylamide used in the reaction, other methacrylic acid/N-phenylmaleimide/methacrylamide copolymers may be prepared by this general procedure. Copolymer 2, a copolymer of N-phenylmaleimide, methacrylamide, and methacrylic acid (50:35:15 mol %), was prepared using methacrylic acid (27.1 g), N-phenylmaleimide (183.7 g), methacrylamide (62.5 g), and AIBN (3.4 g).

Example 2

This Example describes preparation of a o-diazonaphthoquinone containing binder.

Distilled water (102.4 g) was slowly added, with stirring to prevent precipitation, to LB-6564 novolac resin (100 g) dissolved in 2-methoxy-ethanol (247.2 g). Sodium bicarbonate (17.2 g) was added. Then 2-diazo-1-naphthol-4-sulphonyl chloride (18 g) (A. H. Marks, Bradford, UK) (18 g) was slowly added with vigorous stirring and the reaction mixture heated at 40° C. with stirring for 6 hr. The reaction mixture was allowed to cool and the o-diazonaphthoquinone containing binder precipitated by the addition of a solution of about 34.4 g of concentrated hydrochloric acid in about 1416 g of distilled water. The binder was filtered off, re-slurried with distilled water three times and filtered, and dried in a vacuum oven at 40° C.

Example 3

This example illustrates preparation and evaluation of positive-working multi-layer thermally imageable elements. The multi-layer imageable elements were prepared as follows:

Underlayer A coating solution containing Copolymer 2 (85 wt %) and IR Dye B photothermal conversion material (15 wt %) in butyrolactone/methyl ethyl ketone/water/1-methoxypropan-2-ol (15:20:5:60 by weight) was coated onto a substrate. The underlayer coating weight was 2.0 g/$m^2$. The substrate was a 0.3 mm (12 gauge) aluminum sheet that had been electrograined, anodized and subject to treatment with a solution of polyvinylphosphonic acid with a wire wound bar. The resulting intermediate element, consisting of the underlayer on the substrate, was dried at 100° C. for 90 sec.

Imageable Layer Two elements were prepared. A coating solution containing P-3000 (49 wt %), SD-140A (49 wt %), and ethyl violet (2 wt %) in diethyl ketone was coated over the underlayer of the intermediate element with a wire wound bar. The coating weights of the imageable layers were 0.7 g/$m^2$ and 0.45 g/$m^2$. The resulting imageable elements, each consisting of the imageable layer, the underlayer, and the substrate, were each dried at 100° C. for 90 sec.

Heating A sample of each of the imageable elements was additionally heated for various times and temperatures as indicated in Table 1 and Table 2. Heating was carried out in a Mathis Labdryer oven (Werner Mathis A G, Switzerland). Control elements were not heated. Samples of each of the heated and unheated imageable elements were left in a room lighted by white fluorescent strip lights for 12 hr with the imageable layer exposed to the light.

Each element was evaluated by the drop test. A large drop of 956 Developer (solvent based developer, Kodak Polychrome Graphics, Norwalk, Conn.) is placed on the imageable layer of each imageable element at 22° C. and the time required for the developer to remove the layers noted. Results for elements in which the imageable layer coating weight is 0.7 g/$m^2$ are given in Table 1. Results for elements in which the imageable layer coating weight is 0.45 g/$m^2$ are given in Table 2.

TABLE 1[a]

| Heat Treatment | Heat Treatment | Drop Test (sec) | |
|---|---|---|---|
| Temperature (° C.) | Time (sec) | Unexposed | Exposed |
| 0 | 0 | 240 | 5 |
| 140 | 90 | 240 | 10 |
| 140 | 120 | 240 | 20 |
| 140 | 300 | 420 | 180 |
| 140 | 1800 | 720 | 720 |
| 150 | 90 | 420 | 60 |
| 150 | 120 | 420 | 420 |
| 150 | 300 | 720 | 720 |
| 150 | 1800 | 1000 | 1000 |
| 160 | 90 | 720 | 300 |
| 160 | 120 | 840 | 300 |
| 160 | 300 | 1000 | 1000 |
| 160 | 1800 | 1000 | 1000 |

[a]The imageable layer coating weight is 0.7 g/$m^2$.

TABLE 2[a]

| Heat Treatment | Heat Treatment | Drop Test (sec) | |
|---|---|---|---|
| Temperature (° C.) | Time (sec) | Unexposed | Exposed |
| 0 | 0 | 90 | 5 |
| 140 | 90 | 120 | 15 |
| 140 | 120 | 90 | 25 |
| 140 | 300 | 240 | 120 |

TABLE 2[a]-continued

| Heat Treatment Temperature (° C.) | Heat Treatment Time (sec) | Drop Test (sec) Unexposed | Exposed |
|---|---|---|---|
| 140 | 1800 | 540 | 180 |
| 150 | 90 | 360 | 40 |
| 150 | 120 | 420 | 120 |
| 150 | 300 | 480 | 240 |
| 150 | 1800 | 480 | 480 |
| 160 | 90 | 180 | 120 |
| 160 | 120 | 180 | 240 |
| 160 | 300 | 720 | 420 |
| 160 | 1800 | 1000 | 420 |

[a]The imageable layer coating weight is 0.45 $g/m^2$.

Two samples of the imageable element in which the coating weight of the imageable layer was 0.7 $g/m^2$ were heated in the Mathis Labdryer oven at 160° C. for 90 sec. One was exposed to white light as described above. The other was not exposed to white light. Each element was imaged with 830 nm radiation using the internal test pattern (plot 12) of a Creo Trendsetter 3230 (CREO Corp., British Columbia, Canada) at 115 $mJ/cm^2$ and machine processed with 956 developer (solvent based developer, Kodak Polychrome Graphics, Norwalk, Conn., USA) in a Kodak Polychrome Graphics 85 NS processor. Accurate copies of the test image were made in each case.

Examples 4–10

A series of multi-layer imageable elements was prepared as follows:

Underlayer A coating solution containing copolymer 1 (84.5 wt %), IR Dye A photothermal conversion material (15 wt %), and BYK 307 (0.5 wt %) in butyrolactone/methyl ethyl ketone/water/1-methoxypropan-2-ol (15:20:5:60 by weight) was coated onto the substrate of Example 3 by the procedure of Example 3. The underlayer coating weight was 2.0 $g/m^2$. The resulting intermediate element, consisting of the underlayer on the substrate, was dried at 100° C. for 90 sec.

Imageable Layer The coating solutions described in Table 3 were each coated over the underlayer of the intermediate element produced in the previous step as described in Example 3. The coating solvent for each coating solution was diethyl ketone. The coating weight of each imageable layer was 0.7 $g/m^2$. The resulting imageable elements, each consisting of the imageable layer, the underlayer, and the substrate, were each dried at 100° C. for 90 sec.

TABLE 3[a]

| Component | Example No. 4 | 5 | 6 | 7 | 8 | 9 | 10 |
|---|---|---|---|---|---|---|---|
| SD-140A | 97.5 | 67.5 | 47.5 | 67.5 | 47.5 | 67.5 | 47.5 |
| P-5320 | — | 30 | 50 | — | — | — | — |
| P-3000 | — | — | — | 30 | 50 | — | — |
| Example 2[b] | — | — | — | — | — | 30 | 50 |
| Ethyl violet | 2 | — | 2 | 2 | 2 | 2 | 2 |
| BYK-307 | 0.5 | 0.5 | 0.5 | 0.5 | 0.5 | 0.5 | 0.5 |

[a]wt % of each component in diethyl ketone.
[b]The o-diazonaphthoquinone containing binder produced in Example 2.

Heating A sample of each of the imageable elements was additionally heated at 160° C. for 120 sec in the Mathis Labdryer oven. The fan speed was 1000 rpm. Control elements were not heated.

Samples of each of the heated and unheated imageable elements were exposed to room light and evaluated by the drop test as described in Example 3. The results are given in Table 4.

TABLE 4

| Example Number | No Heat Treatment[a] Unexposed | Exposed | Heat Treatment[a] Unexposed | Exposed |
|---|---|---|---|---|
| 4 | 110 | 110 | 120 | 110 |
| 5 | 140 | 20 | 420 | 420 |
| 6 | 180 | 20 | >420 | 420 |
| 7 | 210 | 30 | >600 | 600 |
| 8 | 210 | 5 | >600 | 600 |
| 9 | 120 | 35 | 240 | 80 |
| 10 | 160 | 25 | 360 | 80 |

[a]Time required for the developer to remove the layers in sec.

Examples 11–12

An imageable layer consisting of P-3000 (98%) and ethyl violet (2%) in diethyl ketone was coated over the underlayer of Example 4. The coating weight of the imageable layer was 0.7 $g/m^2$. The resulting imageable element, consisting of the imageable layer, the underlayer, and the substrate, was dried at 100° C. for 90 sec.

Two samples of the imageable element were additionally heated in the Mathis Labdryer oven. The fan speed was 1000 rpm. Example 11 was heated for 10 min at 160° C. Example 12 was heated for 2 min at 180° C.

Samples of each of the heated elements and a sample of the unheated element were exposed to room light and evaluated by the drop test as described in Example 3.

TABLE 5

| Example Number | No Heat Treatment[a] Unexposed | Exposed | Heat Treatment[a] Unexposed | Exposed |
|---|---|---|---|---|
| 11 | 180 | 5 | >900 | >900 |
| 12 | 180 | 5 | >600 | >600 |

[a]Time required for the developer to remove the layers in sec.

A sample of the imageable element was heated in a Mathis Labdryer oven at 180° C. for 2 min. It was imaged with 150 $mJ/cm^2$ of 830 nm radiation and developed as in Example 3. An accurate copy of the test pattern was produced.

Having described the invention, we now claim the following and their equivalents.

What is claimed is:

1. A method for forming a multi-layer positive-working imageable element, the imageable element comprising:

a substrate comprising a hydrophilic surface;

an underlayer over the hydrophilic surface of the substrate; and an imageable layer over the underlayer;

the method comprising the steps of:

(a) coating the underlayer over the hydrophilic surface of the substrate;

(b) coating the imageable layer over the underlayer; and (c) heating the imageable element at a temperature between about 130° C. and about 200° C. for a time sufficient to increase resistance of the imageable element to an alkaline developer and to decrease the white light sensitivity of the imageable element;

in which:

the imageable element comprises a photothermal conversion material;

the imageable layer is ink receptive;

the imageable layer is insoluble in the alkaline developer;

the imageable layer comprises:

a first polymeric material, and an o-diazonaphthoquinone containing material; and the underlayer comprises a second polymeric material.

2. The method of claim 1 in which the imageable element is heated to a temperature between about 130° C. and about 200° C. for about 30 seconds to about 10 minutes.

3. The method of claim 1 in which the second polymeric material is selected from the group consisting of (1) copolymers that comprise a carboxylic acid, an N-substituted cyclic imide, and an amide functional group; (2) copolymers that comprise a pendent urea group; and (3) copolymers that comprise a pendent sulfonamide group.

4. The method of claim 1 in which the o-diazonaphthoquinone containing material is either a compound that comprises an o-diazonaphthoquinone moiety attached to a ballasting moiety that has a molecular weight of at least 1500 but less than about 5000, or a novolac resin derivatized with an o-diazonaphthoquinone moiety.

5. The method of claim 4 in which the first polymeric material is either a novolac resin or a novolac resin derivatized with an o-diazonaphthoquinone moiety.

6. The method of claim 5 in which second polymeric material is selected from the group consisting of (1) copolymers that comprise a carboxylic acid, an N-substituted cyclic imide, and an amide functional group; (2) copolymers that comprise a pendent urea group; and (3) copolymers that comprise a pendent sulfonamide group.

7. The method of claim 6 in which the imageable element is heated to a temperature between about 130° C. and about 200° C. for about 30 seconds to about 10 minutes.

8. The method of claim 1 in which the first polymeric material is either a novolac resin or a novolac resin derivatized with an o-diazonaphthoquinone moiety.

9. The method of claim 8 in which the second polymeric material is a copolymer that comprises about 25 to about 75 mol % of N-phenylmaleimide; about 10 to about 50 mol % of methacrylamide; and about 5 to about 30 mol % of methacrylic acid.

10. The method of claim 9 in which the second polymeric material comprises about 35 to about 60 mol % of the N-phenylmaleimide; about 15 to about 40 mol % of the methacrylamide; and about 10 to about 30 mol % of the methacrylic acid.

11. The method of claim 8 in which the second polymeric material comprises about 20 to 80 wt % of one of more monomers represented by the general formula:

$$CH_2{=}C(R){-}CO_2{-}X{-}NH{-}CO{-}NH{-}Y{-}Z,$$

in which R is —H or —CH3; X is a bivalent linking group; Y is a substituted or unsubstituted bivalent aromatic group; and Z is —OH, —COOH, or —$SO_2NH_2$.

12. The method of claim 11 in which R is $CH_3$; X is —$(CH_2CH_2)$—; Y is unsubstituted 1,4-phenylene; and Z is —OH.

13. The method of claim 8 in which the second polymeric material comprises (1) about 10 to 90 mol % of a sulfonamide containing monomer unit; (2) acrylonitrile or methacrylonitrile; and (3) methyl methacrylate or methyl acrylate.

14. The method of claim 8 in which the imageable element is heated to a temperature between about 130° C. and about 200° C. for about 30 seconds to about 10 minutes.

15. The method of claim 1 in which the first polymeric material is a novolac resin and the o-diazonaphthoquinone containing material is novolac resin derivatized with an o-diazonaphthoquinone moiety.

16. The method of claim 1 in which the second polymeric material is a copolymer that comprises about 25 to about 75 mol % of N-phenylmaleimide; about 10 to about 50 mol % of methacrylamide; and about 5 to about 30 mol % of methacrylic acid.

17. The method of claim 1 in which the first polymeric material is novolac resin and the o-diazonaphthoquinone containing material is a compound that comprises an o-diazonaphthoquinone moiety attached to a ballasting moiety that has a molecular weight of at least 1500 but less than about 5000.

18. The method of claim 1 in which the second polymeric material is a copolymer that comprises about 25 to about 75 mol % of N-phenylmaleimide; about 10 to about 50 mol % of methacrylamide; and about 5 to about 30 mol % of methacrylic acid.

19. A multi-layer positive-working imageable element, the element comprising a substrate comprising a hydrophilic surface; an underlayer over the hydrophilic surface of the substrate; and an imageable layer over the underlayer;

the element prepared by a method comprising the steps of:

(a) coating the underlayer over the hydrophilic surface of the substrate;

(b) coating the imageable layer over the underlayer; and (c) heating the imageable element at a temperature between about 130° C. and about 200° C. for a time sufficient to increase resistance of the imageable element to an alkaline developer and to decrease the white light sensitivity of the imageable element;

in which:

the imageable element comprises a photothermal conversion material;

the imageable layer is ink receptive;

the imageable layer is insoluble in the alkaline developer;

the imageable layer comprises:

a first polymeric material, and an o-diazonaphthoqulnone containing material; and the underlayer comprises a second polymeric material.

20. The element of claim 19 in which the imageable element is heated to a temperature between about 130° C. and about 200° C. for about 30 seconds to about 10 minutes.

* * * * *